United States Patent
Vicard et al.

(10) Patent No.: US 8,782,880 B2
(45) Date of Patent: Jul. 22, 2014

(54) APPARATUS FOR ASSEMBLING CHIP DEVICES ON WIRES

(75) Inventors: Dominique Vicard, Saint-Nazaire-les-Eymes (FR); Jean Brun, Champagnier (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 199 days.

(21) Appl. No.: 13/115,419

(22) Filed: May 25, 2011

(65) Prior Publication Data

US 2012/0073128 A1 Mar. 29, 2012

(30) Foreign Application Priority Data

May 25, 2010 (EP) .................................... 10354024

(51) Int. Cl.
- B23P 19/00 (2006.01)
- H01R 43/00 (2006.01)
- B65B 15/00 (2006.01)
- H01L 25/065 (2006.01)

(52) U.S. Cl.
CPC ............. B65B 15/00 (2013.01); H01L 25/0655 (2013.01); H01L 2924/0002 (2013.01)
USPC ............... 29/748; 29/33 M; 29/33 F; 29/740; 29/759

(58) Field of Classification Search
USPC ............. 29/748, 33 M, 33 F, 564.6, 728, 740, 29/759, 854; 140/1, 105, 112; 438/107, 438/113, 464
See application file for complete search history.

(56) References Cited

U.S. PATENT DOCUMENTS

| | | | |
|---|---|---|---|
| 4,077,439 A * | 3/1978 | Hamuro et al. | 140/1 |
| 4,083,413 A * | 4/1978 | Miller | 172/601 |
| 2005/0116387 A1 | 6/2005 | Davison et al. | |
| 2009/0227069 A1 | 9/2009 | Brun et al. | |

FOREIGN PATENT DOCUMENTS

| | | |
|---|---|---|
| EP | 2 099 060 A1 | 9/2009 |
| GB | 2 017 038 A | 10/1979 |
| JP | A 2008-124231 | 5/2008 |
| WO | WO 96/23432 | 8/1996 |

OTHER PUBLICATIONS

Brun et al., "Packaging and wired interconnections for insertion of miniaturized chips in smart fabrics," Microelectronics and Packaging Conference, Jun. 15, 2009.

* cited by examiner

*Primary Examiner* — Thiem Phan
(74) *Attorney, Agent, or Firm* — Oliff PLC

(57) ABSTRACT

An apparatus for assembling chip devices on a wire, each chip device comprising two substantially parallel lateral walls, and a groove in one of the lateral walls for receiving said wire. The apparatus includes a pinching device having two opposing surfaces, the distance between the opposing surfaces being substantially constant and substantially equal to the distance between the two lateral walls of a chip device. A wire feeder is adapted to continuously feed the wire in contact with one of the opposing surfaces of the pinching device. A chip device feeder is adapted to drive chip devices, one at a time, between the opposing surfaces, with their grooves turned towards the wire. The pinching device may comprise two cylindrical rollers having rotation axes substantially perpendicular to the wire, the opposing surfaces being formed by respective surfaces of the rollers.

20 Claims, 3 Drawing Sheets

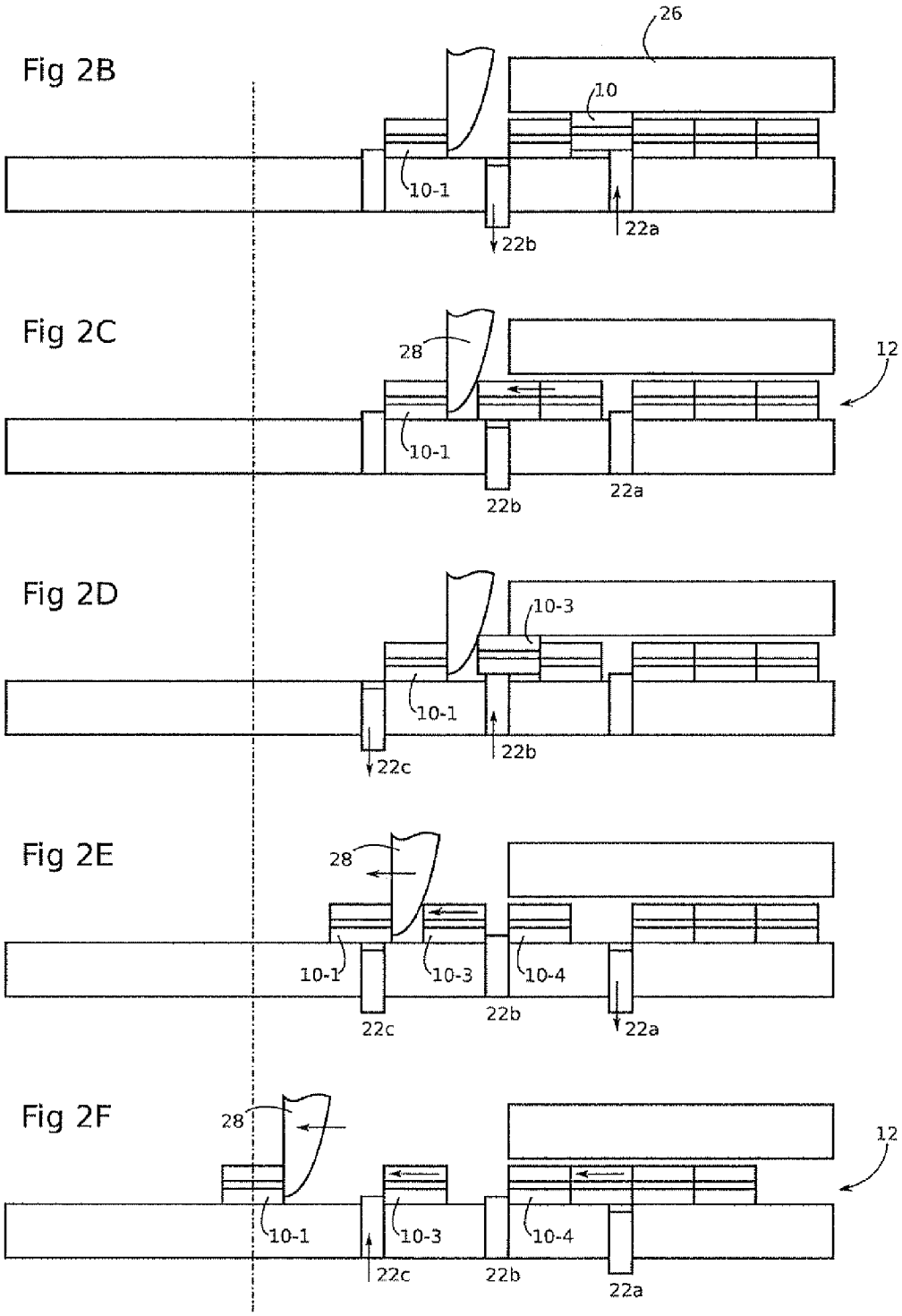

APPARATUS FOR ASSEMBLING CHIP DEVICES ON WIRES

FIELD OF THE INVENTION

The invention relates to the assembly of small devices, having a size that can be smaller than one millimeter, especially devices embedding a microelectronic chip, on a wire in order to form a string of devices that is better adapted to further processing.

STATE OF THE ART

Patent application EP2099060 discloses various methods of assembling such chip devices on a wire. Each chip device is provided with a groove adapted to the diameter of the wire. The disclosed methods involve temporarily fixing the chip devices on a tape and using conventional wire-bond equipment to individually run the wire through the groove of each chip device. The wire can be fixed in the grooves by gluing or soldering, or the grooves can be configured so that the wire clips into the grooves.

Patent application GB2017038 discloses an apparatus for stringing resistances on a belt. The two wires of a resistance are each sandwiched between two adhesives tapes.

The article "Packaging and wired interconnections for insertion of miniaturized chips in smart fabrics" from Jean Brun et al. disclosed in "MICROELECTRONICS AND PACKAGING CONFERENCE" of Jun. 15, 2009, discloses devices having grooves secured to a wire.

SUMMARY OF THE INVENTION

There is a need for equipment better adapted to assembling chip devices on wires, enabling, in particular, a reduction of manufacturing times.

This need is addressed by an apparatus for assembling chip devices on a wire, each chip device comprising two substantially parallel lateral walls, and a groove in one of the lateral walls for receiving the wire. The apparatus includes a pinching device comprising two opposing surfaces, the distance between the opposing surfaces being substantially constant and substantially equal to the distance between the two lateral walls of a chip device. A wire feeder is adapted to continuously feed the wire in contact with one of the opposing surfaces of the pinching device. A chip device feeder is adapted to drive chip devices, one at a time, between the opposing surfaces, with their grooves turned towards the wire.

In a preferred embodiment, the pinching device comprises two cylindrical rollers having rotation axes substantially perpendicular to the wire, said opposing surfaces being formed by respective surfaces of the rollers.

In a preferred embodiment, the chip device feeder comprises a storage groove adapted to lead a series of chip devices in contact with each other to the pinching device. A separator is arranged near the pinching device for creating a gap between the last and penultimate chip devices in the storage groove. A hook has an alternating movement between a first position in the gap, where it hooks the last chip device, and a second position near said opposing surfaces of the pinching device, where it releases the last chip device.

BRIEF DESCRIPTION OF THE DRAWINGS

FIGS. 2A-2F schematically show a side view of a detail of the apparatus, in several steps of processing chip devices.

DESCRIPTION OF PREFERRED EMBODIMENTS

Figure 1:
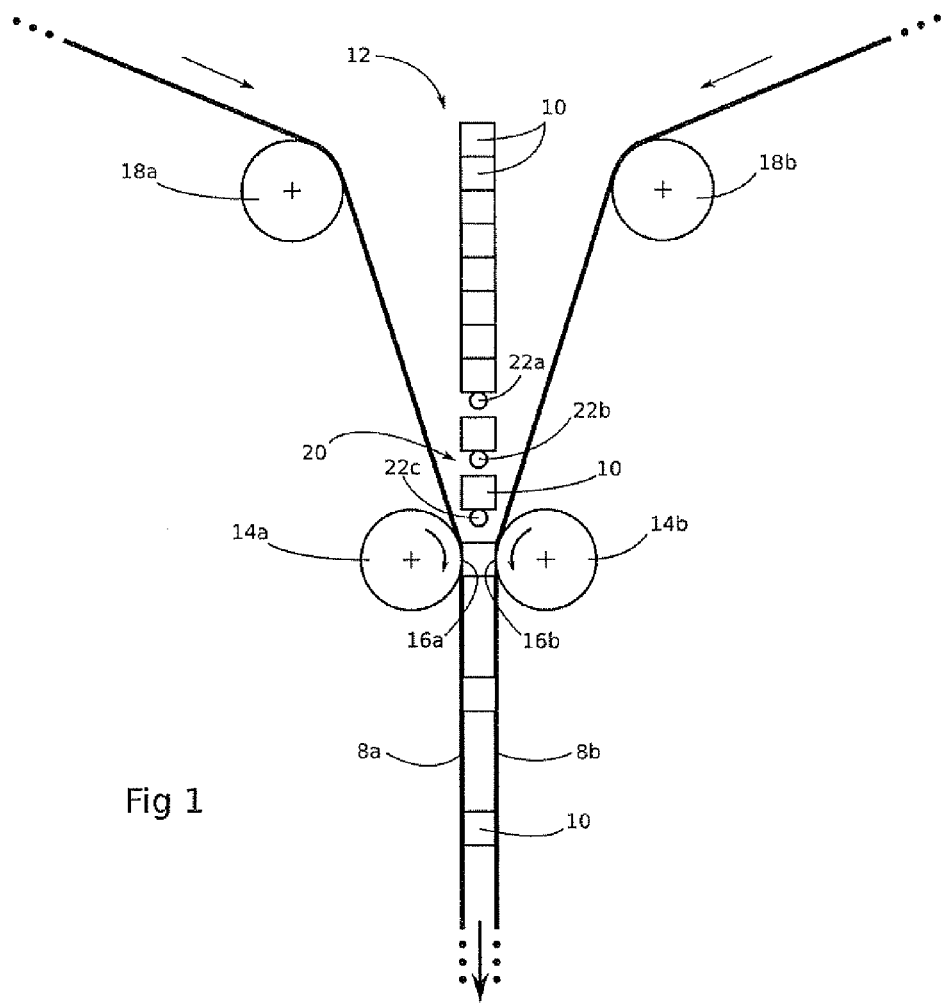
FIG. 1 schematically shows a general view of an embodiment of an apparatus for assembling chip devices between two parallel wires.

FIG. 1 schematically shows a general view of an embodiment of an apparatus for assembling chip devices between two parallel wires 8a, 8b, for forming a ladder-shaped string of chip devices.

A series of chip devices 10 awaiting processing are stored in a pile at an input area 12 of the apparatus, for instance a groove adapted to the width of the chip devices. Each chip device 10, generally in the shape of a parallelepiped, has two opposite, substantially parallel lateral walls, each provided with a longitudinal groove adapted to the diameter of the wires. The chip devices are piled up in area 12 such that their longitudinal grooves are aligned.

A passive pinching device 14 placed at the bottom of area 12 comprises, in a preferred embodiment, two cylindrical rollers 14a and 14b. By "passive pinching device" it is understood that the rollers 14a, 14b are at a substantially constant distance from each other during operation, i.e. no alternating pinching movement is implemented. The axes of the rollers 14a, 14b are substantially perpendicular to the wires, and their spacing is such that two opposing surfaces 16a, 16b of the rollers are at a distance substantially equal to the width of the chip devices (i.e. the distance between the lateral walls of the chip devices).

The rollers 14a, 14b are a preferred embodiment to define the opposing surfaces 16a, 16b of the pinching device. Indeed, this will reduce friction and wear. They may be comprised of ball bearings. In a less favorable alternative, the opposing surfaces 16a, 16b may be formed by fixed elements.

Each wire 8a, 8b is fed in continuous motion along a respective opposing surface 16a, 16b, in alignment with the respective grooves of the chip devices in area 12. Each wire 8a, 8b is for instance fed from a reel, not shown, over an auxiliary roller 18a, 18b, then along the respective opposing surface 16a, 16b, and leaves the apparatus parallel to the other wire, at the distance defined by the opposing surfaces, thus the chip device size. Auxiliary rollers 18a, 18b ensure that the wires 8a, 8b enter the pinching device 14 at an angle avoiding interference with the chip devices 10 stored in area 12.

A chip device feeder 20 arranged between area 12 and pinching device 14, described in more detail later, takes one chip device 10 at a time from storage area 12, and moves it between rollers 14. As the chip device approaches the rollers, its opposite grooves start engaging with the wires 8a and 8b, whereby the wires and chip device start aligning with each other. The feeder continues pushing the chip device through the gap between rollers 14, whereby the opposing surfaces 16a, 16b force the wires into the grooves of the chip device, throughout the length of the grooves, as the chip device travels with the wires through the gap.

The assembled string thus leaving the rollers 14 is for instance stored on a reel, not shown, that may also provide the required traction to pull the wires through the assembly apparatus.

The chip devices may be fixed to the wires in various manners. For example, the wires may be bare metal and the grooves of the chip devices include metal areas. The string may then go through a solder bath as it exits the apparatus, whereby the metal areas of the grooves are soldered to the wires.

In a preferred embodiment, the grooves of the chip devices are configured to clip over the wires. No subsequent operation is then required in the assembly.

In order to avoid breaking chip devices that may be wider than a nominal value, one of the rollers 14a, 14b is preferably spring biased towards the other roller. The spring force is chosen sufficient to insert the wires in the grooves, but insufficient to break a chip device that has a width larger than the nominal value. This solution moreover allows the processing of chip devices having widths spanning over a range.

FIG. 1 also partially shows a detail of the chip device feeder 20. The feeder comprises three retractable pins 22a-22c, leaving room for a single chip device 10 between two consecutive pins. These pins form part of a device separator, described in more detail below, allowing to take one chip device at a time from the pile of chip devices stored in area 12.

The separation mechanism preferably operates with the aid of gravity, i.e. the apparatus is tilted so that the pinching device 14 lies below area 12. The chip devices in area 12 then pile up naturally against the pins 22a-22c, and will tend to fall naturally as the pins are retracted. To aid the gravity effect, especially if the chip devices are very small (smaller than one millimeter), vibration may be applied to the apparatus.

Instead of using vibration, the chips may also be transported by aid of an air cushion in combination with either gravity or a pushing mechanism.

Furthermore, the chips may be transported by mechanical means, e.g. pushing rods.

Instead of using a chip device feeder 20 in combination with a separation mechanism, the chips may be fed directly to the pinching device 14 by means of a conventional pick-and-place machine used to place surface-mount devices on printed circuit boards.

FIGS. 2A-2F schematically show a side view of the chip device feeder 20, in several steps of processing chip devices. The apparatus is shown horizontally, although, as mentioned above, it is rather tilted so that the right portion, comprising the storage area 12, is raised above the left portion.

The elements of the apparatus are assembled around a base plate 24. Roller 14b is shown only on FIG. 2A—in FIGS. 2B-2F the rollers are represented by their axes. The chip devices 10 slide over plate 24, preferably in a guiding groove. Only the bottom of the guiding groove is visible, the side walls of the groove not being shown for sake of clarity. The side walls of the guiding groove are interrupted in the area of rollers 14a and 14b, where the wires enter laterally (wire 8b is shown partially). The grooves of the shown chip devices are visible. The storage area 12 is partially covered by a plate 26 that prevents the stored chip devices 10 from exiting the groove due to vibrations generated by the apparatus. A hook 28 is arranged to alternately take a new chip device from the pile 12 and push it through the rollers 14a, 14b, as explained below.

Figure 2A:
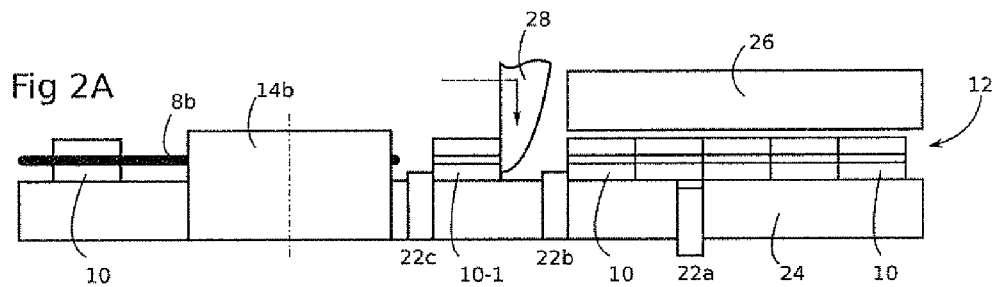

In FIG. 2A, pin 22a is retracted and pins 22b and 22b are up. A pile of chip devices 10 rests against pin 22b by gravity, covering retracted pin 22a. A single chip device 10-1 rests against pin 22c. As a chip device 10-2 leaves the rollers 14a, 14b with wire 8b inserted in its groove, hook 28 arrives from between the rollers, first rising clear of chip device 10-1, then descending behind it, in the gap left between chip device 10-1 and the remaining chip devices retained by pin 22b.

In FIG. 2B, pin 22b is retracted and pin 22a is raised. The chip device 10 that happened to be over pin 22a is lifted against plate 26. However, pin 22a, in its raised position, does not protrude more than the clearance between the chip devices and plate 26, thus the chip device 10 over pin 22a can still slide.

In FIG. 2C, the two first chip devices that lied against pin 22b now slide over retracted pin 22b to come to rest against hook 28. The remaining chip devices in area 12 are held back by pin 22a.

In FIG. 2D, pin 22c is retracted and pin 22b is raised. The chip device 10-3 that happened to lie over pin 22b is lifted, but it can still slide.

In FIG. 2E, pin 22a is retracted and hook 28 starts moving towards the left, accompanying chip device 10-1 over retracted pin 22c towards the rollers. Chip 10-3 slides over pin 22b and follows the hook by gravity. The chip device 10-4 that was behind chip device 10-3 stops against pin 22b.

In fact, as soon as pin 22c is retracted in FIG. 2D, chip device 10-1 is likely to start slipping leftwards by gravity. In the first portion of the travel of chip device 10-1 towards the rollers, hook 28 may have no active role.

In FIG. 2F, pin 22c is raised as hook 28 travels over it. Chip device 10-3 thus stops against pin 22c. Hook 28 is shown in its final position where it places chip device 10-1 between the rollers, where the wires are clipped into the chip device's grooves, and the chip device travels further with the wires. In the meantime, further chip devices contained in storage area 12 slide over pin 22a and come to rest against chip device 10-4.

In this final phase, hook 28 exerts on chip device 10-1 sufficient pressure to start inserting the wires into the chip device's grooves. Gravity alone may not be sufficient for this purpose.

The cycle then starts over as in FIG. 2A. The pitch of the chip devices in the final string is defined by the wire travel speed and the cycle time of hook 28.

Figure 3:
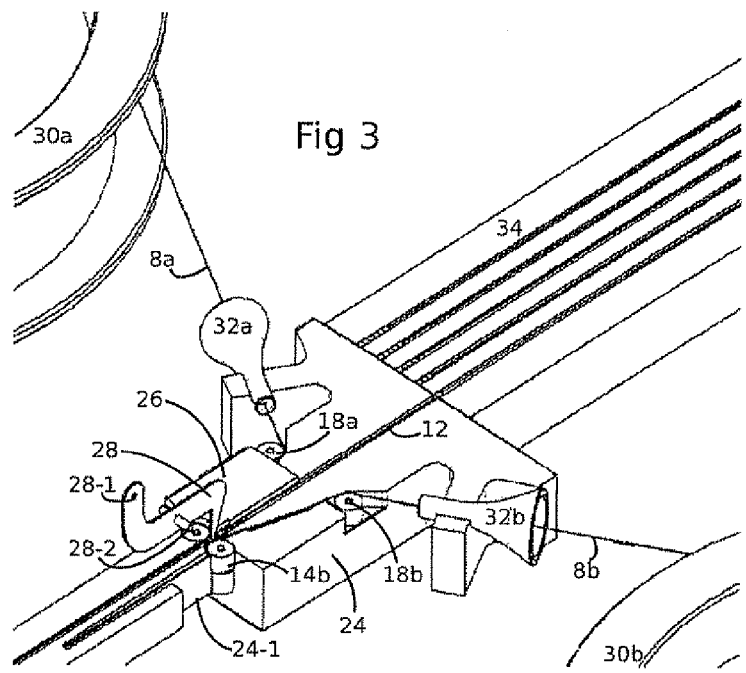
FIG. 3 shows a general perspective view of a detailed embodiment of the apparatus.

FIG. 3 shows a general perspective view of a detailed embodiment of the apparatus. Same elements as in the previous figures are designated by same reference numerals.

Wires 8a and 8b are fed from respective reels 30a and 30b. The wires are led to their respective auxiliary rollers through funnel shaped elements 32a, 32b, which ensure that the wires arrive to rollers 18a, 18b at a substantially constant position, regardless of the widely varying exit positions from reels 30a, 30b.

Hook 28 has a first axis 28-1 by which a back and forth movement is transferred to the hook, and a second axis 28-2 arranged to follow a cam (not shown) that defines the up and down movements of the hook as it travels back and forth.

In order to ensure a spring bias of roller 14b towards roller 14a, plate 24 comprises a split starting near roller 14b and extending along the chip device guiding groove towards the exit area of the apparatus. This split defines a splinter-like element 24-1, having a far end, away from roller 14b, integral with plate 24, and a free end, near roller 14b, cut away from the rest of plate 24. Roller 14b is mounted on this free end. Thus the width and length of element 24-1 define the spring bias force.

FIG. 3 further shows a hopper 34 containing chip device refills for the storage groove 12. Hopper 34 comprises a series of parallel grooves, each containing a pile of chip devices having the desired orientation for assembly on wires 8a and 8b. The hopper 34 is initially attached to base plate 24 such that its first groove is in key with the storage groove 12. As soon as the first groove of the hopper is empty, the hopper is shifted by one step, putting its next groove in key with groove 12, and so on until the hopper is empty.

Each hopper 34 may be pre-filled by a conventional pick-and-place machine used to place surface-mount devices on printed circuit boards.

Figure 4:
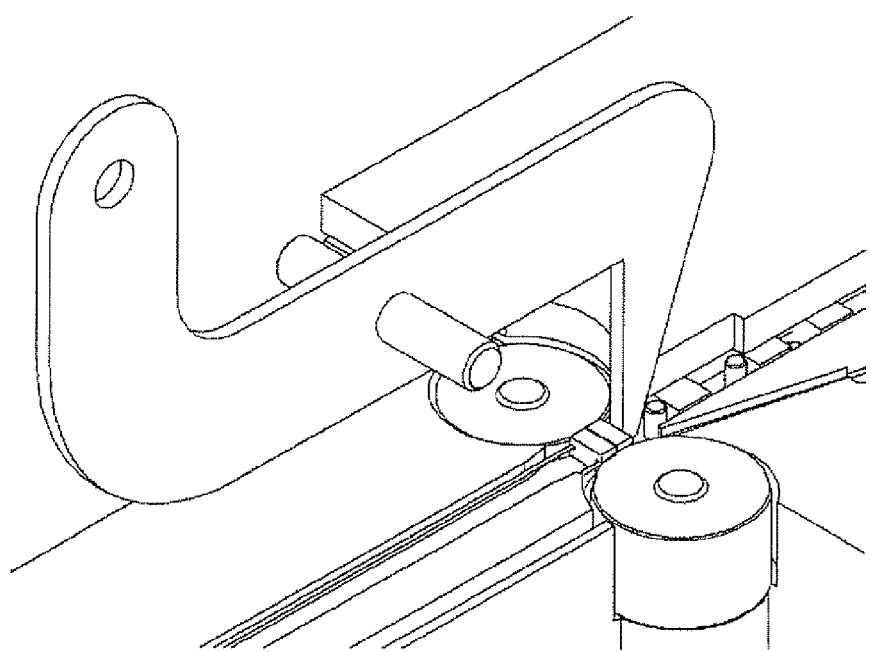
FIG. 4 shows en enlarged detail of FIG. 3.

FIG. 4 shows an enlarged detail of FIG. 3, in the area of rollers 14a, 14b, better revealing some shapes that were too small in FIG. 3. As is visible in this figure, the side walls of the groove in which the chip devices travel are interrupted only in close proximity to the rollers. This ensures that the chip devices are maintained laterally, and don't skew, all along the assembly process.

The wires are guided in grooves just before they are fed to the rollers. These grooves ensure that the wires arrive on the rollers at the height corresponding to the lateral grooves in the chip devices.

Although an assembly of chip devices between two wires has been described as a preferred embodiment, the teachings of the present disclosure apply similarly to the assembly of chip devices on a single wire. In such a case, the apparatus can simply be used with a single wire. One of rollers 18a, 18b and one of rollers 14a, 14b may be omitted.

The invention claimed is:

1. Apparatus for assembling chip devices on at least one wire, each chip device comprising two substantially parallel lateral walls, and a groove in at least one of the lateral walls for receiving said at least one wire, the apparatus comprising:
    a pinching device fixed in a first direction, comprising two opposing surfaces, the distance between the opposing surfaces being measured in a second direction perpendicular to the first direction, and being substantially constant and substantially equal to the distance between the two lateral walls of a chip device, the pinching device being configured to have both the chip device and the wire pass through an area in between the two opposing surfaces;
    a wire feeder adapted to continuously feed said wire in contact with one of the opposing surfaces of the pinching device; and
    a chip device feeder adapted to drive chip devices in the first direction, one at a time, between said opposing surfaces, with their grooves turned towards the wire.

2. Apparatus according to claim 1, wherein the chip device feeder comprises:
    a storage groove adapted to lead a series of chip devices in contact with each other to the pinching device;
    a separator arranged near the pinching device for creating a gap between the last and penultimate chip devices in the storage groove; and
    a hook having an alternating movement between a first position in said gap, where it hooks said last chip device, and a second position near said opposing surfaces of the pinching device, where it releases said last chip device.

3. Apparatus according to claim 2, wherein the separator comprises a series of retractable pins arranged along the feed groove near the pinching device.

4. Apparatus according to claim 3, for assembling chip devices between two wires, each chip device comprising a groove in each of its lateral walls, the apparatus comprising two wire feeders, each adapted to continuously feed a respective one of the two wires in contact with a respective one of the opposing surfaces of the pinching device.

5. Apparatus according to claim 2, for assembling chip devices between two wires, each chip device comprising a groove in each of its lateral walls, the apparatus comprising two wire feeders, each adapted to continuously feed a respective one of the two wires in contact with a respective one of the opposing surfaces of the pinching device.

6. Apparatus according to claim 1, for assembling chip devices between two wires, each chip device comprising a groove in each of its lateral walls, the apparatus comprising two wire feeders, each adapted to continuously feed a respective one of the two wires in contact with a respective one of the opposing surfaces of the pinching device.

7. Apparatus according to claim 1, wherein the pinching device comprises two cylindrical rollers.

8. Apparatus according to claim 7, the cylindrical rollers having rotation axes substantially perpendicular to the wire, said opposing surfaces being formed by respective surfaces of the rollers.

9. Apparatus according to claim 8, wherein one of said rollers is spring biased towards the other roller.

10. Apparatus according to claim 9, for assembling chip devices between two wires, each chip device comprising a groove in each of its lateral walls, the apparatus comprising two wire feeders, each adapted to continuously feed a respective one of the two wires in contact with a respective one of the opposing surfaces of the pinching device.

11. Apparatus according to claim 8, for assembling chip devices between two wires, each chip device comprising a groove in each of its lateral walls, the apparatus comprising two wire feeders, each adapted to continuously feed a respective one of the two wires in contact with a respective one of the opposing surfaces of the pinching device.

12. Apparatus according to claim 1, wherein the two opposing surfaces are flat.

13. Apparatus for assembling chip devices on a wire, each chip device comprising two substantially parallel lateral walls, and a groove in one of the lateral walls for receiving said wire, wherein the apparatus comprises:
    a pinching device comprising two opposing surfaces, the distance between the opposing surfaces being substantially constant and substantially equal to the distance between the two lateral walls of a chip device, the pinching device being configured to pinch both each chip device and the wire; and
    a wire feeder adapted to continuously feed said wire in contact with one of the opposing surfaces of the pinching device; and
    a chip device feeder adapted to drive chip devices, one at a time, between said opposing surfaces, with their grooves turned towards the wire, the device feeder including:
        a storage groove adapted to lead a series of chip devices in contact with each other to the pinching device;
        a separator arranged near the pinching device for creating a gap between the last and penultimate chip devices in the storage groove; and
        a hook having an alternating movement between a first position in said gap, where it hooks said last chip device, and a second position near said opposing surfaces of the pinching device, where it releases said last chip device.

14. Apparatus according to claim 13, wherein the separator comprises a series of retractable pins arranged along the feed groove near the pinching device.

15. Apparatus according to claim 14, for assembling chip devices between two wires, each chip device comprising a groove in each of its lateral walls, the apparatus comprising two wire feeders, each adapted to continuously feed a respective one of the two wires in contact with a respective one of the opposing surfaces of the pinching device.

16. Apparatus according to claim 13, for assembling chip devices between two wires, each chip device comprising a groove in each of its lateral walls, the apparatus comprising two wire feeders, each adapted to continuously feed a respective one of the two wires in contact with a respective one of the opposing surfaces of the pinching device.

17. Apparatus according to claim 13, wherein the pinching device comprises two cylindrical rollers having rotation axes substantially perpendicular to the wire, said opposing surfaces being formed by respective surfaces of the rollers.

18. Apparatus according to claim 17, wherein one of said rollers is spring biased towards the other roller.

19. Apparatus according to claim 18, for assembling chip devices between two wires, each chip device comprising a groove in each of its lateral walls, the apparatus comprising two wire feeders, each adapted to continuously feed a respective one of the two wires in contact with a respective one of the opposing surfaces of the pinching device.

20. Apparatus according to claim 17, for assembling chip devices between two wires, each chip device comprising a groove in each of its lateral walls, the apparatus comprising two wire feeders, each adapted to continuously feed a respective one of the two wires in contact with a respective one of the opposing surfaces of the pinching device.

\* \* \* \* \*